(12) United States Patent
Choi et al.

(10) Patent No.: US 8,803,564 B2
(45) Date of Patent: Aug. 12, 2014

(54) TUNABLE CAPACITANCE CONTROL CIRCUIT AND TUNABLE CAPACITANCE CONTROL METHOD

(71) Applicant: Samsung Electro-Mechanics Co., Ltd., Gyeonggi-do (KR)

(72) Inventors: Jae Hyouck Choi, Gyeonggi-do (KR); Sung Hwan Park, Gyeonggi-do (KR); Jeong Hoon Kim, Gyeonggi-do (KR); Chan Yong Jeong, Gyeonggi-do (KR); Sang Wook Park, Gyeonggi-do (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/773,524

(22) Filed: Feb. 21, 2013

(65) Prior Publication Data

US 2014/0035631 A1     Feb. 6, 2014

(30) Foreign Application Priority Data

Aug. 1, 2012    (KR) .................. 10-2012-0084473

(51) Int. Cl.
*H03C 3/00* (2006.01)
(52) U.S. Cl.
USPC .......................................................... 327/111
(58) Field of Classification Search
CPC ........................................................ H01G 5/18
USPC .......................................................... 361/277
See application file for complete search history.

(56) References Cited

U.S. PATENT DOCUMENTS

| 7,825,715 | B1 | 11/2010 | Greenberg |
| 2009/0134949 | A1* | 5/2009 | He ........................ 333/17.3 |
| 2011/0002080 | A1* | 1/2011 | Ranta ..................... 361/277 |

FOREIGN PATENT DOCUMENTS

| KR | 10-2004-0097171 A | 11/2004 |
| KR | 10-2011-0059516 A | 6/2011 |
| WO | 2009-108391 A1 | 9/2009 |

OTHER PUBLICATIONS

KR 10-2012-0084473 Notice of Allowance dated Mar. 20, 2014; 2pgs.

* cited by examiner

*Primary Examiner* — Daniel Rojas
(74) *Attorney, Agent, or Firm* — Bracewell & Giuliani LLP; Brad Y. Chin

(57) ABSTRACT

Disclosed herein are a tunable capacitance control circuit and a tunable capacitance control method. The tunable capacitance control method is a tunable capacitance control method by a tunable capacitance control circuit including an MIM capacitor, a plurality of FET switches, and a control unit, wherein the control unit outputs control signals allowing only one of the plurality of (n) FET switches to be switched on and the remaining (n−1) FET switches to be switched off to the plurality of FET switches, thereby obtaining a desired tunable capacitance value.

5 Claims, 3 Drawing Sheets

US 8,803,564 B2

TUNABLE CAPACITANCE CONTROL CIRCUIT AND TUNABLE CAPACITANCE CONTROL METHOD

CROSS REFERENCE(S) TO RELATED APPLICATIONS

This application claims the benefit under 35 U.S.C. Section 119 of Korean Patent Application Serial No. 10-2012-0084473, entitled "Tunable Capacitance Control Circuit and Tunable Capacitance Control Method" filed on Aug. 1, 2012, which is hereby incorporated by reference in its entirety into this application.

BACKGROUND OF THE INVENTION

1. Technical Field

The present invention relates to a tunable capacitance control circuit and a tunable capacitance control method which is used in an integral circuit (IC), or the like, and more particularly, to a tunable capacitance control circuit and a tunable capacitance control method capable of increasing a Q (Q=1/RC) factor by reducing a total field effect transistor (FET) on-resistance value as compared to a scheme according to the related art using a control scheme of switching on only one of N FET switches configuring a unit cell and switching off other FET switches thereof.

2. Description of the Related Art

In accordance with the development of an efficient communication system, a plurality of communication standards having different operation frequencies and modulation schemes have been applied. Since various standards include a form in which a plurality of independent signal paths are coupled in parallel with each other, a size and a cost of a circuit increase. If a resettable circuit may be designed, the cost and the size of a parallel circuit may decrease. Therefore, research into an adaptive radio frequency (RF) circuit has recently been conducted.

The RF circuit may be generally divided into two regions, that is, a receiver and a transmitter. A receiver path has been successfully implemented so as to be tunable. However, a transmitter path has not been implemented so as to be tunable. Since a tunable capacitor or inductor capable of maintaining its characteristics even at high power is essentially required, it is difficult to implement the transmitter path, in particular, a power amplifier. If tunable components may be used in a high power application field, performance of the transmitter, in particular, the power amplifier may be significantly improved.

In accordance with the development of a wireless communication technology, fourth generation (4G) mobile communication representative of long term evolution (LTE) as well as current third generation (3G) mobile communication is emerging. As 4G mobile communication network functions are added to the existing 3G mobile communication network, a scheme to be supported in a single mobile phone become increase. In relation to this, the following functions are required for the current RF performance.

1) There is a need to cover various frequency bands using a single RF chain.

2) There is a need to optimize matching of a front-end including an antenna during the use of the mobile phone to optimize power consumed in the power amplifier (PA).

3) There is a need to optimize the matching of the front-end including the antenna during the use of the mobile phone to optimize a receiving rate of a low noise amplifier (LNA).

In order to implement the functions as described above, there is a need to add a tunable matching network (TMN) to the RF front-end having the existing fixed structure to add flexibility. Here, a tunable component is used for tunable performance. As the tunable component, a tunable capacitor has been used. In this case, in order to reduce loss of a system, a Q (Q=1/RC) factor of the tunable capacitor should be excellent.

RELATED ART DOCUMENT

Patent Document (Patent Document 1) Korean Patent Laid-Open Publication No. 10-2011-0059516

(Patent Document 2) Korean Patent Laid-Open Publication No. 10-2004-0097171

SUMMARY OF THE INVENTION

An object of the present invention is to provide a tunable capacitance control circuit and a tunable capacitance control method capable of increasing a Q (Q=1/RC) factor by reducing a total field effect transistor (FET) on-resistance value using a control scheme of using a control scheme of switching on only one of N FET switches configuring a unit cell and switching off other FET switches thereof and thus capable of optimizing power consumption in a power amplifier (PA) and a receiving rate in a low noise amplifier (LNA).

According to an exemplary embodiment of the present invention, there is provided a tunable capacitance control circuit including: a metal-insulator-metal (MIM) capacitor; a plurality of field effect transistor (FET) switches connected in series with the MIM capacitor; and a control unit applying switch on or off control signals to each of the gate terminals of the plurality of FET switches, wherein the control unit outputs the control signals allowing only one of the plurality of (n) FET switches to be switched on and the remaining (n−1) FET switches to be switched off, thereby obtaining a desired tunable capacitance value.

In obtaining the desired tunable capacitance value (Cmim), the control unit may adjust and obtain a "Cmim2" value and a Coff value according to the switch off the FET by the following Equation.

$$C_{MIM}(C\text{total}) = \frac{\frac{C\text{off}}{n-1} * C_{MIM2}}{\frac{C\text{off}}{n-1} + C_{MIM2}}$$

The MIM capacitor and the plurality of FET switches connected in series with the MIM capacitor may constitute a single unit circuit in themselves, and the unit circuits may be increased in a form of $2^{n-1}$ (n=1, 2, 3 . . . ) to form a plurality of unit circuit groups that are connected in parallel with each other.

The plurality of FET switches may be metal oxide semiconductor field effect transistors (MOSFETs).

According to another exemplary embodiment of the present invention, there is provided a tunable capacitance control method by a tunable capacitance control circuit including an MIM capacitor, a plurality of FET switches, and a control unit, wherein the control unit outputs control signals allowing only one of the plurality of (n) FET switches to be switched on and the remaining (n−1) FET switches to be switched off to the plurality of FET switches, thereby obtaining a desired tunable capacitance value.

In obtaining the desired tunable capacitance value (Cmim), the control unit may adjust and obtain a "Cmim2" value and a Coff value according to the switch off the FET by the following Equation.

$$C_{MIM}(Ctotal) = \frac{\frac{Coff}{n-1} * C_{MIM2}}{\frac{Coff}{n-1} + C_{MIM2}}$$

The plurality of FET switches may be metal oxide semiconductor field effect transistors (MOSFETs).

DESCRIPTION OF THE PREFERRED EMBODIMENTS

Terms and words used in the present specification and claims are not to be construed as a general or dictionary meaning but are to be construed as meaning and concepts meeting the technical ideas of the present invention based on a principle that the inventors can appropriately define the concepts of terms in order to describe their own inventions in best mode.

Thorough the specification, unless explicitly described to the contrary, the word "comprise" and variations such as "comprises" or "comprising", will be understood to imply the inclusion of stated elements but not the exclusion of any other elements. In addition, the terms "-er", "-or", "module", and "unit" described in the specification mean units for processing at least one function and operation, and can be implemented by hardware components or software components and combinations thereof.

Exemplary embodiments of the present invention will now be described in detail with reference to the accompanying drawings.

Here, prior to describing the exemplary embodiment of the present invention, a tunable capacitance control method according to the related art will be described in order to help the understanding of the present invention.

Figure 1:
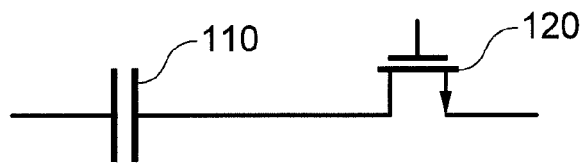
FIG. 1 is a diagram showing an example of a metal-insulator-metal (MIM) capacitor and field effect transistor (FET) switch integration type tunable capacitor used in a tunable matching network (TMN).

FIG. 1 is a diagram showing an example of a metal-insulator-metal (MIM) capacitor and field effect transistor (FET) switch integration type tunable capacitor used for a tunable matching network (TMN).

As shown in FIG. 1, the MIM capacitor and FET switch integration type tunable capacitor is configured of a series connection circuit between an MIM capacitor 110 and an FET switch 120.

A quality factor (Q factor), which is a parameter important for the tunable matching network (TMN), may be represented by the following Equation.

$$Q = \frac{\text{Im}}{\text{Re}} \approx \frac{Xc}{R} \propto \frac{1}{RC}$$

In the above Equation, R means a resistance (Ron) in a state in which the FET switch is switched on. Here, Ron may be represented by the following Equation.

$$R_{ON} = \frac{1}{u_n C_{ox} \frac{W}{L}(V_{GS} - V_{TH})}$$

Figure 2:
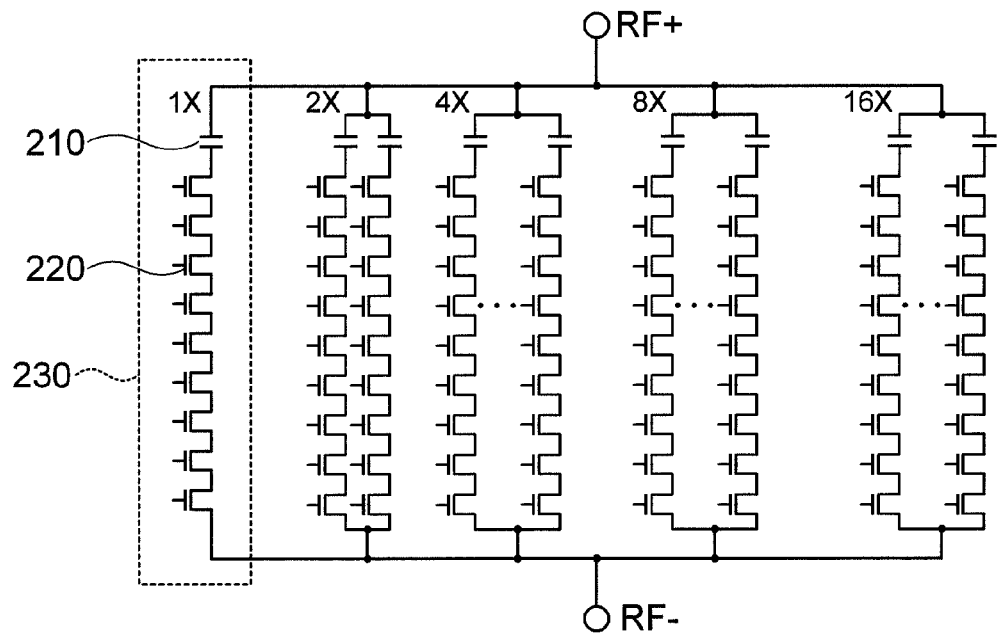
FIG. 2 is a diagram showing a configuration of a tunable capacitor according to the related art configured based on the MIM capacitor and FET switch integration type tunable capacitor of FIG. 1.

FIG. 2 is a diagram showing a configuration of a tunable capacitor according to the related art configured based on the MIM capacitor and FET switch integration type tunable capacitor of FIG. 1.

As shown in FIG. 2, the tunable capacitor according to the related art has a structure in which a plurality of unit cells 230 each including an MIM capacitor 210 and a plurality of FET switches 220 connected in series with each other are connected in parallel with each other. Therefore, a Q factor of the tunable capacitor becomes equal to that of the unit cell 230.

In this case, when the FET switch 220 is switched "on", it is made to be equivalent to a resistor (Ron), and when the FET switch 220 is switched "off", it is made to be equivalent to a capacitor (Coff).

The tunable capacitor according to the related art as described above has obtained a desired capacitance value by controlling all FET switches 220 of the unit cell 130 so as to be switched "on" or "off".

Figure 3:
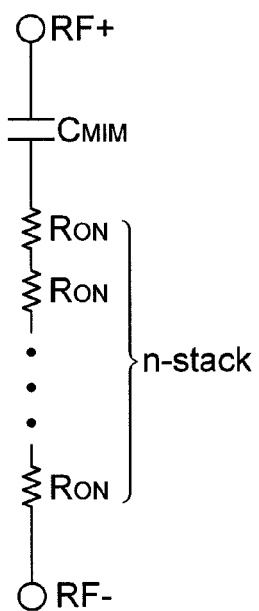
FIG. 3 is an equivalent circuit diagram of a unit cell when n stacked FET switches are switched on in FIG. 2.

FIG. 3 is an equivalent circuit diagram of a unit cell when n stacked FET switches are switched on in FIG. 2.

As shown in FIG. 3, when the n stacked FET switches are switched on, the unit cell may be made to be equivalent to a series connection circuit between an MIM capacitor (CMIM) and n Rons. In this case, the Q factor may be represented by the following Equation.

$$Q = \frac{1}{2\pi f * C_{MIM} * n * Ron}$$

$$Ctotal = C_{MIM}$$

The tunable capacitor according to the related art switches on all of the n FET switches so that Ctotal becomes $C_{MIM}$. However, in this case, a total "ON" resistance (Ron_total) of the FET switch becomes n times of an ON resistance of one FET, such that the Q factor is reduced.

An object of the present invention that is derived in order to solve problems of the method according to the related art as described above is to provide a tunable capacitance control circuit and a tunable capacitance control method capable of increasing a Q (Q=1/RC) factor by reducing a total field effect transistor (FET) on-resistance value using a control scheme of using a control scheme of switching on only one of N FET switches configuring a unit cell and switching off other FET switches thereof and thus capable of optimizing power consumption in a power amplifier (PA) and a receiving rate in a low noise amplifier (LNA).

Figure 4:
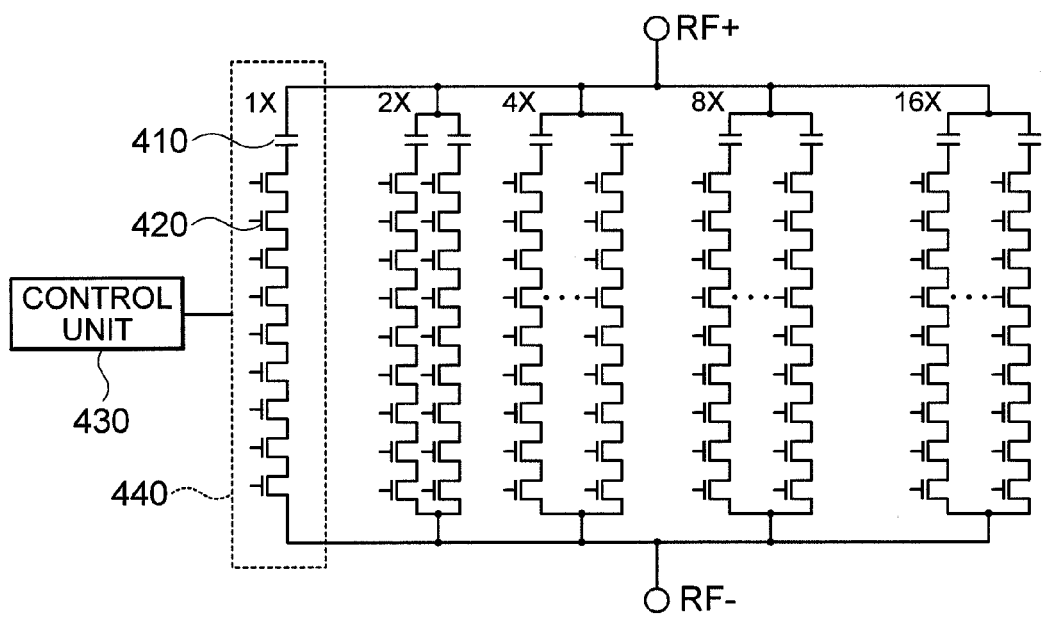
FIG. 4 is a diagram schematically showing a configuration of a tunable capacitance control circuit according to the exemplary embodiment of the present invention.

FIG. 4 is a diagram schematically showing a configuration of a tunable capacitance control circuit according to the exemplary embodiment of the present invention.

Referring to FIG. 4, the tunable capacitance control circuit according to the exemplary embodiment of the present invention is configured to include an MIM capacitor 410, a plurality of FET switches 420 connected in series with the MIM capacitor 410, and a control unit 430 applying switch on or off control signals to each of the gate terminals of the plurality of FET switches 420.

Here, the control unit 430 outputs control signals allowing only one of the plurality of (n) FET switches 420 to be switched on and the remaining (n−1) FET switches to be switched off, thereby obtaining a desired tunable capacitance value.

In this case, in obtaining the desired tunable capacitance value (Cmim), the control unit 430 adjusts and obtains a "Cmim2" value and a Coff value according to the switch off of the FET by the following Equation.

$$C_{MIM}(Ctotal) = \frac{\frac{Coff}{n-1} * C_{MIM2}}{\frac{Coff}{n-1} + C_{MIM2}}$$

In addition, the MIM capacitor 410 and the plurality of FET switches 420 connected in series with the MIM capacitor 410 constitute a single unit circuit 440 in themselves, and the unit circuits 440 are increased in a form of $2^{n-1}$ (n=1, 2, 3 ... ) (i.e. a first unit circuit (1X) includes one circuit configured of the MIM capacitor 410 and the plurality of FET switches 420, a second unit circuit (2X) includes two circuits each configured of the MIM capacitor 410 and the plurality of FET switches 420, and a third unit circuit (4X) includes four circuits each configured of the MIM capacitor 410 and the plurality of FET switches 420) to form a plurality of unit circuit groups that are connected in parallel with each other.

Further, as the plurality of FET switches 420, general FETs may be used. However, it is preferable that metal oxide semiconductor field effect transistors (MOSFETs) are used as the plurality of FET switches 420.

A tunable capacitance control method by the tunable capacitance control circuit according to the exemplary embodiment of the present invention having the configuration as describe above will be briefly described with reference to FIG. 5.

Figure 5:
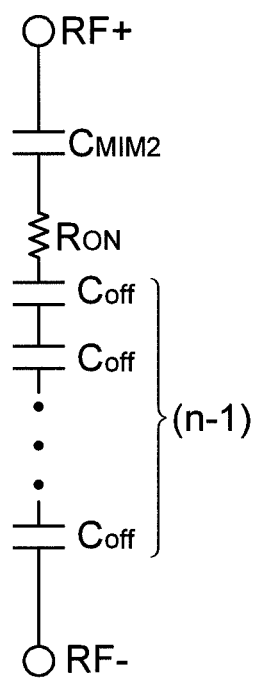
FIG. 5 is a diagram illustratively describing a concept of a tunable capacitance control method according to the exemplary embodiment of the present invention.

FIG. 5 is a diagram illustratively describing a concept of a tunable capacitance control method according to the exemplary embodiment of the present invention.

As shown in FIG. 5, in the tunable capacitance control method according to the exemplary embodiment of the present invention, the control unit 430 outputs the control signals allowing only one of the plurality of (n) FET switches 420 to be switched on and the remaining (n−1) FET switches to be switched off to the plurality of FET switches 420, thereby obtaining a desired tunable capacitance value.

In this case, in obtaining the desired tunable capacitance value (Cmim), the control unit 430 adjusts and obtains a "Cmim2" value and a Coff value according to the switch off of the FET by the following Equation, as described above.

$$C_{MIM}(Ctotal) = \frac{\frac{Coff}{n-1} * C_{MIM2}}{\frac{Coff}{n-1} + C_{MIM2}}$$

Here, the "Cmim2" value and the "Coff" value are values capable of variously being changed according to a design specification applied to a particular product and requirements (conditions) of an orderer or a user and being easily obtained by a simulation using a computer, or the like, according to the above-mentioned design specification or requirements. In the present description, a description of a specific method or result (data) thereof will be omitted.

Figure 6:
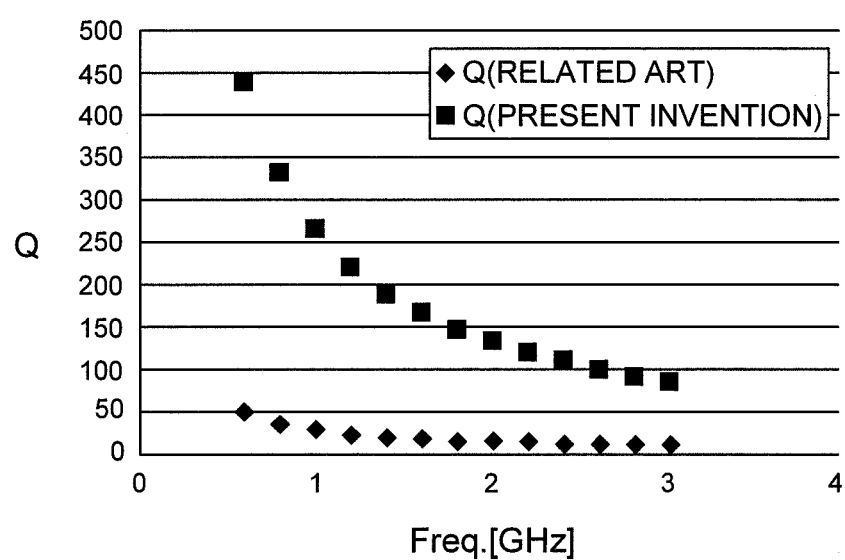
FIG. 6 is a diagram showing a Q factor according to a frequency in each of the tunable capacitance control method according to the related art and the tunable capacitance control method according to the exemplary embodiment of the present invention.

FIG. 6 is a diagram showing a Q factor according to a frequency in each of the tunable capacitance control method according to the related art and the tunable capacitance control method according to the exemplary embodiment of the present invention.

As shown in FIG. 6, it may be appreciated that the Q factor by the tunable capacitance control method according to the exemplary embodiment of the present invention is higher than the Q factor by the tunable capacitance control method according to the related art in the entire frequency range and it may be appreciated that the Q factor by the tunable capacitance control method according to the exemplary embodiment of the present invention is significantly higher than the Q factor by the tunable capacitance control method according to the related art particularly at a frequency of about 1 GHz.

As describe above, in the tunable capacitance control method according to the exemplary embodiment of the present invention, it is possible to increase a Q (Q=1/RC) factor by reducing a total field effect transistor (FET) on-resistance value using a control scheme of using a control scheme of switching on only one of N FET switches and switching off other FET switches thereof and thus optimize power consumption in a power amplifier (PA) and a receiving rate in a low noise amplifier (LNA).

According to the exemplary embodiment of the present invention as described above, it is possible to increase a Q (Q=1/RC) factor by reducing a total field effect transistor (FET) on-resistance value using a control scheme of using a control scheme of switching on only one of N FET switches and switching off other FET switches thereof and thus optimize power consumption in a power amplifier (PA) and a receiving rate in a low noise amplifier (LNA).

Although the exemplary embodiments of the present invention have been disclosed for illustrative purposes, the present invention is not limited thereto, but those skilled in the art will appreciate that various modifications, additions and substitutions are possible, without departing from the scope and spirit of the invention as disclosed in the accompanying claims. Therefore, the protection scope of the present invention must be analyzed by the appended claims and it should be analyzed that all spirits within a scope equivalent thereto are included in the appended claims of the present invention.

What is claimed is:
1. A tunable capacitance control circuit comprising:
   a metal-insulator-metal (MIM) capacitor;
   a plurality of field effect transistor (FET) switches connected in series with the MIM capacitor; and a control unit applying switch on or off control signals to each of the gate terminals of the plurality of FET switches, wherein the control unit outputs the control signals allowing only one of the plurality of (n) FET switches to be switched on and the remaining (n−1) FET switches to be switched off, thereby obtaining a desired tunable capacitance value, and wherein in obtaining the desired tunable capacitance value (Cmim), the control unit adjusts and obtains a "Cmim2" value and a Coff value according to the switch off the FET by the following Equation, $$C_{MIM}(Ctotal) = \frac{\frac{Coff}{n-1} * C_{MIM2}}{\frac{Coff}{n-1} + C_{MIM2}}.$$

2. The tunable capacitance control circuit according to claim 1, wherein the MIM capacitor and the plurality of FET switches connected in series with the MIM capacitor constitute a single unit circuit in themselves, and the unit circuits are increased in a form of $2^{n-1}$ (n=1, 2, 3 ... ) to form a plurality of unit circuit groups that are connected in parallel with each other.

3. The tunable capacitance control circuit according to claim 1, wherein the plurality of FET switches are metal oxide semiconductor field effect transistors (MOSFETs).

4. A tunable capacitance control method by a tunable capacitance control circuit including an MIM capacitor, a plurality of FET switches, and a control unit, wherein the control unit outputs control signals allowing only one of the plurality of (n) FET switches to be switched on and the remaining (n−1) FET switches to be switched off to the plurality of FET switches, thereby obtaining a desired tunable capacitance value, and wherein in obtaining the desired tunable capacitance value (Cmim), the control unit adjusts and obtains a "Cmim2" value and a Coff value according to the switch off the FET by the following Equation $$C_{MIM}(Ctotal) = \frac{\frac{Coff}{n-1} * C_{MIM2}}{\frac{Coff}{n-1} + C_{MIM2}}$$

5. The tunable capacitance control method according to claim 4, wherein the plurality of FET switches are metal oxide semiconductor field effect transistors (MOSFETs).

* * * * *